219-121

SR 06-08-71 OR 3,584,183

United States Patent [11] 3,584,183

[72] Inventors Frank L. Chiaretta
Fullerton;
James A. Luisi, Anaheim; Allen D. Sypherd, Placentia, all of Calif.

[21] Appl. No. 764,680
[22] Filed Oct. 3, 1968
[45] Patented June 8, 1971
[73] Assignee North American Rockwell Corporation

[54] LASER ENCODING OF DIODE ARRAYS
6 Claims, 2 Drawing Figs.

[52] U.S. Cl. 219/121, 331/94.5
[51] Int. Cl. B23k 27/00
[50] Field of Search 219/121, 121 EB, 121 Laser; 331/94.5; 117/212; 346/76; 317/101

[56] References Cited

UNITED STATES PATENTS

| | | | |
|---|---|---|---|
| 3,314,073 | 4/1967 | Becker | 219/121 |
| 3,330,696 | 7/1967 | Ullery | 219/121 |
| 3,377,513 | 4/1968 | Ashby | 317/101 |
| 3,400,456 | 9/1968 | Hanfmann | 219/121 |
| 3,465,091 | 9/1969 | Bradham | 219/121 |
| 3,469,076 | 9/1969 | Saslawsky | 219/121 |
| 3,472,998 | 10/1969 | Popick | 219/121 |

*Primary Examiner*—Milton O. Hirshfield
*Assistant Examiner*—R. Skudy
*Attorneys*—L. Lee Humphries, H. Fredrick Hamann and Robert G. Rogers

ABSTRACT: A method and means for encoding a silicon-on-sapphire diode array by bombarding selected diodes or diode connections with a pulsed laser beam to burn away chosen silicon and metallization areas. Removal of these areas from the diode matrix constitutes an encoding process by elimination of the selected connection and/or diode.

INVENTORS
FRANK L. CHIARETTA
JAMES A. LUISI
ALLEN D. SYPHERD
BY
ATTORNEY

INVENTORS
FRANK L. CHIARETTA
JAMES A. LUISI
BY ALLEN D. SYPHERD

ATTORNEY

LASER ENCODING OF DIODE ARRAYS

BACKGROUND OF THE INVENTION

1. Field of the Invention

The present invention relates to a method and means for encoding diode arrays and, more particularly, to a method and means for encoding a silicon-on-sapphire diode array by selectively bombarding the array with a pulsed laser beam.

2. Description of the Prior Art

In U.S. Pat. No. 3,377,513 issued Apr. 9, 1968 to R. M. Ashby et al. and entitled "Integrated Circuit Diode Matrix" there is disclosed a microminiature, integrated circuit, diode matrix. As described therein, a diode array is fabricated on a dielectric substrate, the material for which is a single crystal, refractory, inorganic oxide such as sapphire, spinel, beryllium oxide or zirconium oxide, the preferred material being sapphire. Fabricated on the dielectric substrate are a plurality of silicon diode elements arranged to form a matrix.

The ability to epitaxially grow thin films of single crystal silicon on an insulating sapphire substrate has led to the development of high density arrays of diodes which find immediate application in compact, read-only memory devices. The unique insulating properties of the sapphire substrate allow simplified circuitry and high density packing without problematic leakage currents. As added benefits, the radiation resistance of the small isolated devices is much better than that of bulk silicon devices and the extremely small junction area possible with silicon-on-sapphire results in low junction capacitance, thus enhancing speed of the arrays.

A first set of parallel conductors is in intimate contact with the dielectric substrate and electrically contact one end of each diode element in the associated row or column of the matrix. A second set of parallel conductors is disposed on the diode array structure so as to cross the first set of conductors, each conductor being electrically connected or not connected to the diode element in the corresponding column or row of the matrix depending on whether or not a diode interconnection is desired at that matrix location. In this manner, each diode position represents a bit location, information being presented as: diode connected—encoded 1, diode missing—encoded 0.

In order to encode the array, each conductor in the second set is selectively electrically connected or not connected to each diode element in the corresponding column or row of the matrix depending on whether or not a diode interconnection is desired at that matrix location. Presently, there are three primary techniques for encoding such arrays. The first technique is to use a custom metallization mask during the deposition of the second set of conductors, the mask having openings corresponding to the locations where connections are to be made. However, for diode array encoding, the custom mask technique presumes knowledge of the bit pattern before manufacture is complete. This precludes long term advance production, unless the demand for that particular pattern is great.

A second technique is to initially deposit connections at all matrix locations and then use a second selective chemical etch to remove connections from a tested memory blank. The selective chemical etch process allows blank memories to be manufactured up to the point of scribing and separating into chips. However, again a custom mask must be made to define which diode linkages are to be etched away.

Either mask approach is desirable when a large number of arrays containing the same information is to be made, e.g. when memories containing standard mathematical tables or data lists are being fabricated or when the diode arrays are designed to perform common logic functions or code translation. However, for custom use, where only a small number of arrays are required, the process is very time-consuming and costly.

A third approach to fabricating the connections involves initial deposition of the entire set of conductors with no diode interconnections whatever. Then, in a subsequent operation, the desired connections are vapor deposited through a separate mask having deposition openings corresponding to data specified by the individual user. This approach, of course, has the advantage of allowing mass production of the basic diode array since only the final step of making the interconnections is a custom, user dependent operation. However, as before, because a custom mask must be made for each configuration, such a scheme is only practical when a large number of arrays containing the same information is to be made. When such is not the case, the procedure is too time-consuming and costly.

SUMMARY OF THE INVENTION

According to the present invention, these and other problems of the prior art are solved by utilizing the focused energy from a pulsed laser to remove selected diode connections and/or diodes from a completed semiconductor diode array. Removal is accomplished by vaporizing the interconnections and/or diodes with the extremely high energy density available in a focused laser beam.

Two embodiments are disclosed. In the first embodiment, the laser beam is focused directly onto the pattern to be removed. The focal plane of the focusing lens is set at the surface of the array and a short depth of field allows removal of the diode without damage to the substrate beneath.

According to the second embodiment, the laser is focused on the diode area through the sapphire substrate. The sapphire substrate, which is approximately 10 mils. thick, is transparent and smooth enough to allow good optical transmission and the removal of the diode is clean and complete with no damage to the sapphire. This latter embodiment has the great advantage that it makes feasible the manufacturing of completed encapsulated arrays using the sapphire substrate as an integral part of the package. The transparency of the sapphire also permits flip-chip bonding techniques to be used with subsequent laser encoding through the substrate. After processing and packaging, these arrays can be taken off the shelf and custom encoded by shooting through the sapphire window without disturbing the integrity of the package.

It is, therefore, an object of the present invention to provide a method and means for the automatic encoding of diode arrays.

It is a further object of the present invention to provide a method and means for encoding large diode arrays utilizing the focused energy from a pulsed laser.

It is a still further object of the present invention to provide an economical process for custom encoding of diode matrix arrays.

It is another object of the present invention to provide a method and means for selectively bombarding a silicon-on-sapphire diode array with a pulsed laser beam to burn away selected silicon and metallization areas.

Still other objects, features and attendant advantages of the present invention will become apparent to those skilled in the art from a reading of the following detailed description of the preferred embodiments constructed in accordance therewith, taken in conjunction with the accompanying drawings wherein like numerals designate like parts in the several figures and wherein:

DESCRIPTION OF THE PREFERRED EMBODIMENTS

Figure 1:
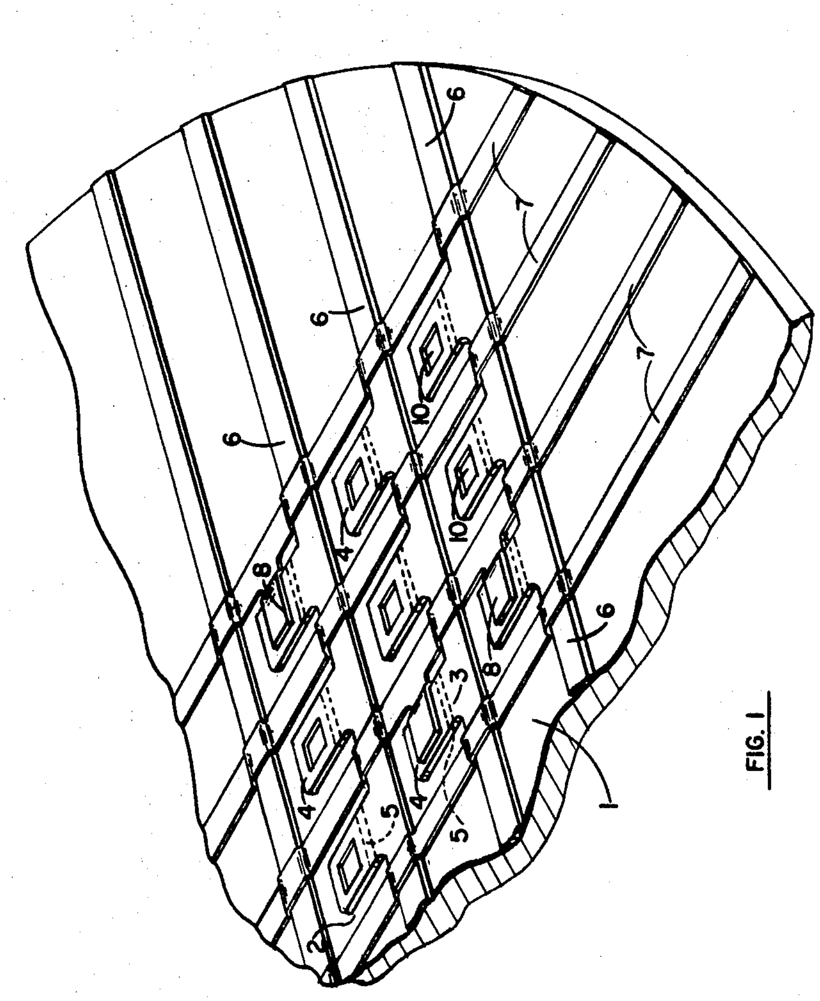
FIG. 1 is a perspective view of a silicon-on-sapphire diode array showing the general features thereof.

Referring now to the drawings and, more particularly, to FIG. 1 thereof, there is illustrated a microminiature diode array fabricated on a dielectric substrate 1, the material for which may be a single crystal, refractory, inorganic oxide, such as sapphire, spinel, beryllium, or zirconium oxide, the preferred material being single crystal sapphire. These materials have the additional common properties of high dielectric strength, being able to withstand the high temperatures associated with common deposition and diffusion techniques, having sufficient hardness to permit polishing of their surface, being nonreactive to the usual chemicals used in processing a semiconductor deposit, and having a coefficient of expansion compatible with common semiconductor materials.

Fabricated on dielectric substrate 1 are a plurality of single-crystal, silicon diode elements 2 arranged to form a matrix. Each diode element 2 has three principle regions, a P+ area 3, an N+ area 4, and an undoped area 5 of N-type material.

A first set of parallel conductors 6, which may be merely extensions of P+ area 3, in intimate contact with dielectric substrate 1, electrically contact one end of each diode element in the associated row of the matrix. Parallel conductors 6 may be formed by standard photolithographic techniques onto dielectric substrate 1 and, as stated before, may be made integral with area 3 of diodes 2. Although not shown in FIG. 1, each of conductors 6 would normally be covered with a dielectric insulating layer for reasons which will become apparent hereinafter.

A second set of parallel conductors 7 is disposed on the diode array on substrate 1 so as to cross the first set of conductors 6. Conductors 7 may be vapor-deposited over the insulating layer on conductors 3.

Each conductor 7 is selectively electrically connected, as at 8, or not connected, as at 10, to each diode element 2 in the corresponding column of the matrix depending on whether or not a diode interconnection is desired at that matrix location.

According to the present invention, the entire set of diode elements 2 are electrically connected as at 8 to conductors 7 so that initially each diode of the array is encoded as a 1. Subsequently, selected diode interconnections and/or diodes are removed to encode the array.

Figure 2:
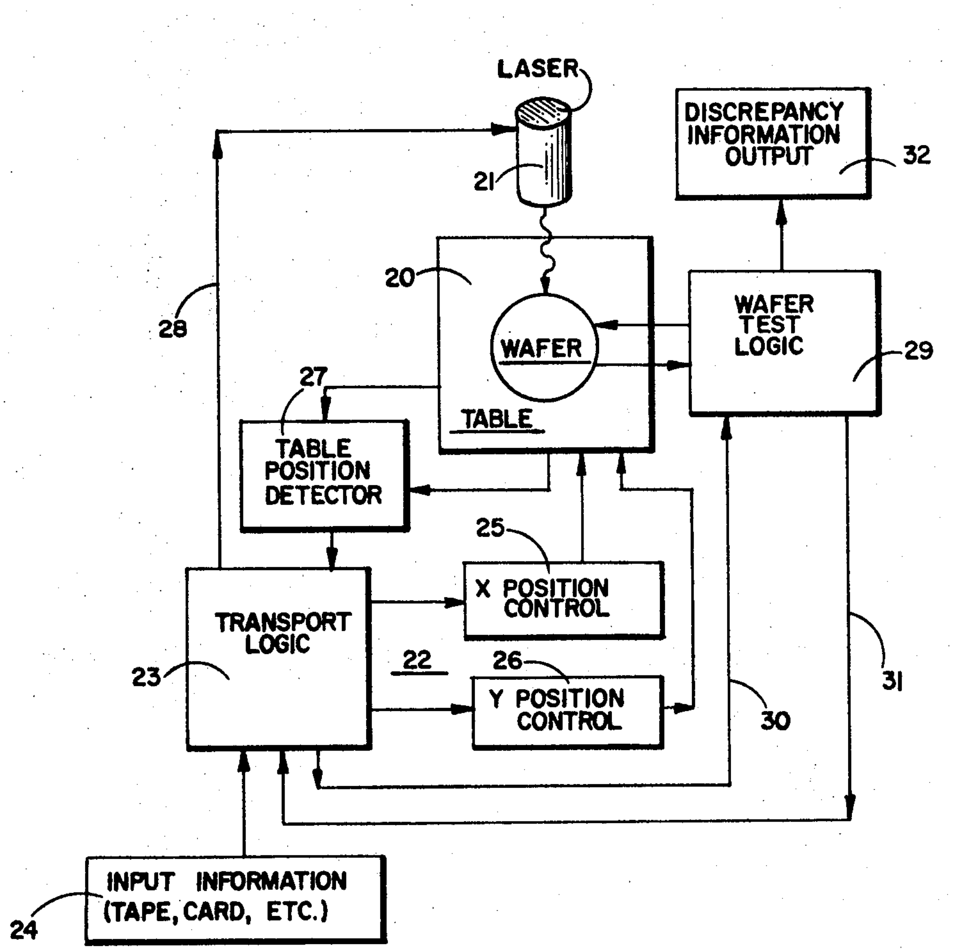
FIG. 2 is a block diagram of an automatic encoder-tester for diode arrays constructed in accordance with the teachings of the present invention.

Referring now to FIG. 2, such selected removal of connections and/or diodes is achieved by selectively bombarding these connections and/or diodes with a pulsed laser beam to burn away chosen silicon and metallization areas. Removal of these areas from the diode matrix constitutes an encoding process by elimination of the selected connection and/or diodes.

Basically, the present system is composed of three parts: an automatically controlled movable table 20 with high precision indexing, a small fixed laser 21 with suitable optics, if necessary, and a control logic with input-output equipment, generally designated 22. The control logic consists of a transport logic circuit 23 which receives input information from a standard data input system 24, such as a tape transport, card reader, etc. Transport logic 23 provides signals to an $x$-position control 25 and a $y$-position control 26 which are operative to adjust the position of table 20 as a function of the inputs thereto. The position of table 20 is detected by a table position detector 27 which applies an input to transport logic 23 which compares the input information from input system 24 with the actual position of table 20 from detector 27 and controls $x$ and $y$ position controllers 25 and 26, respectively, to reduce any error signal to zero. When the error is zero, a signal is conditionally applied by transport logic 23 via line 28 to laser 21 for triggering thereof to remove the selected diode connection and/or diode by vaporizing with the extremely high energy density available in the focused laser beam. As an optional feature, a test logic 29 may be provided to determine after each removal, whether the removal has been complete. Such a test is triggered by a signal from transport logic 23 over line 30. If test logic 29 determines that the selected diode has been completely eliminated, a signal is applied back to transport logic 23 via line 31 to signal that the procedure may be continued. In the event that test logic 29 determines that the diode has not been completely removed, the laser may be triggered again and/or a signal may be applied to a discrepancy information output circuit 32 to signal the occurrence of a malfunction.

Table 20 may be moved sequentially over all diodes in a preset manner. At each diode position, the input encoding instructions are executed by transport logic 23. If a diode is not desired at a particular intersection in the array, laser 21 is triggered and destroys the diode connections and/or the diode. Before moving to the next position, a testing procedure determines whether the state of that position agrees with the input information. If laser action does not remove a target diode completely, information from test results can be used to pulse the laser again. Any discrepancy can be marked by lights, printout or punch tape data.

According to a first embodiment of the present invention, the beam from laser 21 may be focused directly onto the pattern to be removed. The focal plane of the focusing lens is set at the surface of the diode and a short depth of field allows removal of the metal without damage to the substrate beneath.

According to another embodiment of the present invention, and where the substrate is made of sapphire, laser 21 may be focused on the diode array through sapphire substrate 1. The sapphire substrate, which is approximately 10 mils. thick, is transparent and smooth enough to allow good optical transmission and the removal of the diode is clean and complete with no damage to the sapphire. This latter embodiment has the great advantage that it makes feasible the manufacture of complete encapsulated arrays using the sapphire substrate as an integral part of the package. After processing and packaging, these arrays can be taken off the shelf and custom encoded by shooting laser 21 through the sapphire window without disturbing the integrity of the package.

The laser energy and power required for clean removal of the linkages is fairly critical. Too much power results in damage to the substrate material with possible shattering if the excessive power produces sufficient local internal thermal gradients. Conversely, if the power is too small, more energy is required to complete the vaporization of the metal linkage. Excessive energy may cause cracking of the substrate due to local heating. Experiments have shown that an incident energy of 3 to 6 millijoules in 0.1 to 1 millisecond gives adequate burnoff with minor substrate damage. Experiments with a Q-switched laser having a pulse length of 50 nsec. showed very clean burnoff with only 0.27 millijoules incident on the array. Another successful experiment used 1 millijoule in 30 microseconds.

The area of desired burnoff in a typical diode array is a 0.5 mil. × 1 mil. aluminum connection. Focusing the laser through a microscope objective gives a destructive diameter of about 0.5 mil. from a one-eighth inch neodymium doped laser rod. Assuming 30 watts of peak power in the laser pulse and that 90 percent of the energy is within the 0.5 mil. diameter, the peak power density within the target area is on the order of $22\times10^6$ watts/cm.$^2$.

It can, therefore, be seen that in accordance with the present invention there is provided a method and means for the automatic encoding of large diode arrays which helps to drastically reduce production time, matrix errors and the cost of read-only memory devices. Even though the encoding is done sequentially, a saving in time over chemical etching is realizable. Furthermore, the present system is quite accurate and versatile and requires very little effort to custom encode each array.

While the invention has been described with respect to several physical embodiments constructed in accordance therewith, it will be apparent to those skilled in the art that various modifications and improvements may be made without departing from the scope and spirit of the invention. Accordingly, it is to be understood that the invention is not to be limited by the specific illustrative embodiments, but only by the scope of the appended claims.

We claim:

1. A method for encoding a diode array fabricated on a dielectric substrate, said array including diodes initially connected between rows and columns of conductors, said method comprising the steps of, positioning a laser at selected diode connections, pulsing said laser for producing a pulsed laser beam, said beam burning away a diode connection for encoding a logical bit of information at each selected diode connection.

2. The method of claim 1 wherein said pulsed laser beam is focused on said diode connections through said sapphire substrate.

3. The method of claim 1 wherein said pulsed laser beam is focused directly onto the diode connection.

4. A system for encoding a diode array fabricated on a dielectric substrate, said diode array comprising a plurality of rows and columns of conductors having diodes initially connected between each of said rows and columns of conductors, said system comprising, laser means for bombarding selected diode connections with a pulsed laser beam for electrically removing said selected diode connections, means for sequentially moving said laser means from one selected diode connection to another selected diode connection until the diode array is completely encoded.

5. A method for encoding a diode array fabricated on a dielectric substrate, said array having diodes initially connected between rows and columns of conductors, said method comprising the step of, positioning a laser at a selected diode location, pulsing said laser for producing a pulsed laser beam, said beam burning away the diode.

6. A system for encoding a diode array fabricated on a dielectric substrate, said diode array comprising a plurality of rows and columns of conductors having diodes initially connected between each of said rows and columns of conductors, said system comprising, laser means for bombarding selected diodes for electrically removing diodes from selected connections, means for sequentially moving said laser means from one selected diode to another selected diode until the diode array is completely encoded.